(12) United States Patent
Managaki

(10) Patent No.: US 11,145,705 B2
(45) Date of Patent: Oct. 12, 2021

(54) DISPLAY DEVICE AND METHOD FOR MANUFACTURING THE SAME

(71) Applicant: Japan Display Inc., Tokyo (JP)

(72) Inventor: Nobuto Managaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/737,127

(22) Filed: Jan. 8, 2020

(65) Prior Publication Data

US 2020/0227507 A1    Jul. 16, 2020

(30) Foreign Application Priority Data

Jan. 10, 2019   (JP) .............................. JP2019-002589

(51) Int. Cl.
*H01L 27/32*       (2006.01)
*H01L 51/00*       (2006.01)
*G06F 1/16*        (2006.01)
*H01L 51/56*       (2006.01)

(52) U.S. Cl.
CPC ........ *H01L 27/3276* (2013.01); *G06F 1/1652* (2013.01); *H01L 27/323* (2013.01); *H01L 51/0097* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 10,074,673 B2* | 9/2018 | Choi ................... | H01L 27/1259 |
| 10,121,842 B2* | 11/2018 | Lee ..................... | H01L 27/1255 |
| 10,121,977 B2* | 11/2018 | Lee ..................... | H01L 27/3272 |
| 2016/0172428 A1 | 6/2016 | Song et al. | |
| 2017/0148826 A1* | 5/2017 | Choi ................... | H01L 27/1244 |
| 2017/0170255 A1* | 6/2017 | Ha ...................... | H01L 27/3276 |
| 2018/0165996 A1* | 6/2018 | Ochi ..................... | H01L 51/50 |
| 2020/0084888 A1* | 3/2020 | Lee ................... | H01L 23/49838 |
| 2020/0161384 A1* | 5/2020 | Wang ................... | G02F 1/1333 |

* cited by examiner

*Primary Examiner* — J. E. Schoenholtz
(74) *Attorney, Agent, or Firm* — Michael Best & Friedrich LLP

(57) ABSTRACT

A display device includes a flexible substrate, a display portion provided on a first surface of the flexible substrate and including a plurality of pixels, a first penetrating wiring located to penetrate the flexible substrate, and a second penetrating wiring located to penetrate the flexible substrate at a position farther from the display portion than the first penetrating wiring. The flexible substrate includes a curved portion between the first penetrating wiring and the second penetrating wiring. The first penetrating wiring and the second penetrating wiring are electrically connected with each other without being extended on the curved portion.

13 Claims, 15 Drawing Sheets

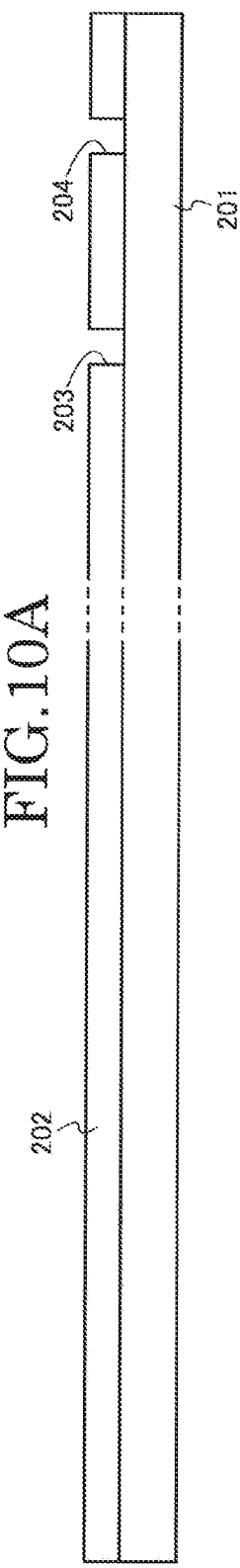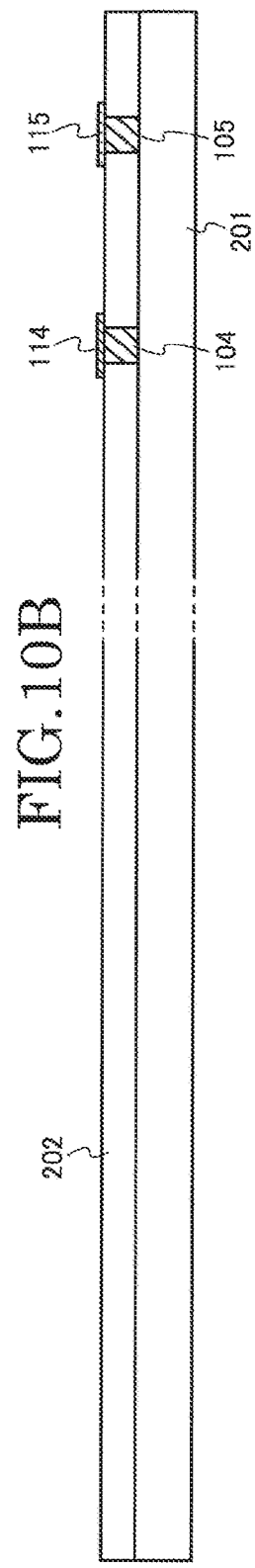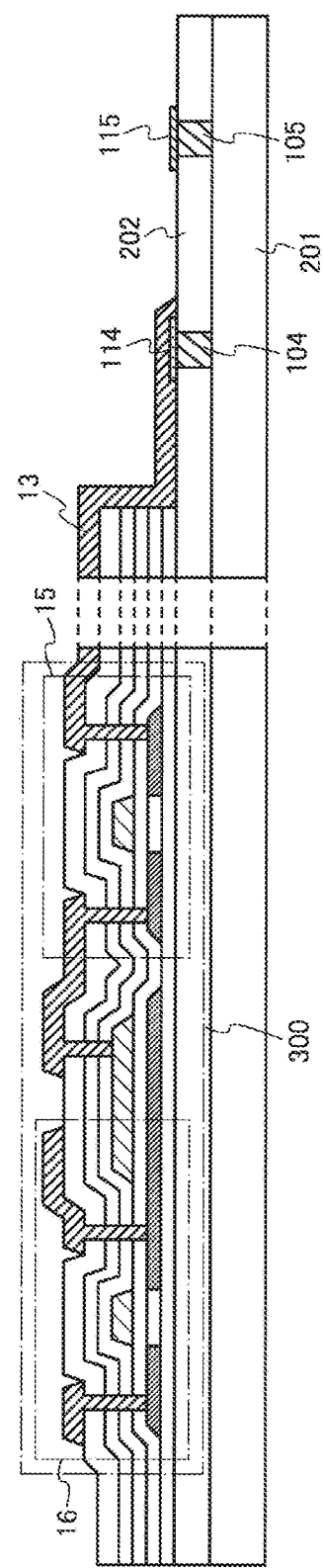

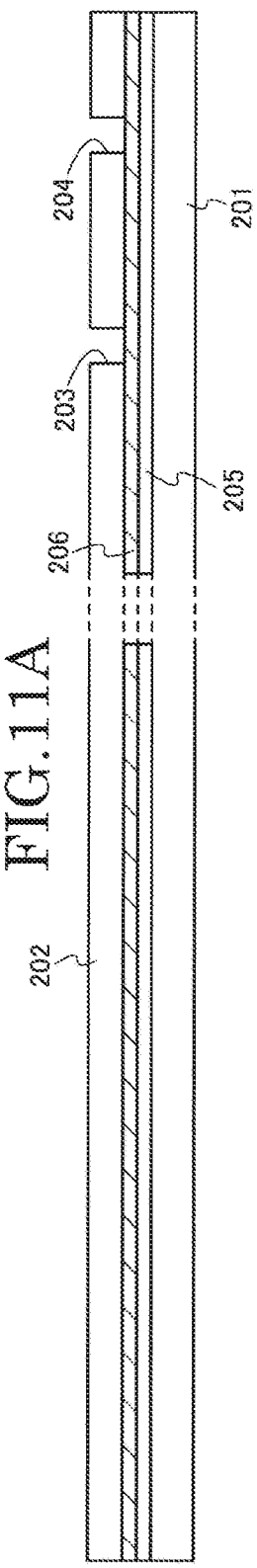
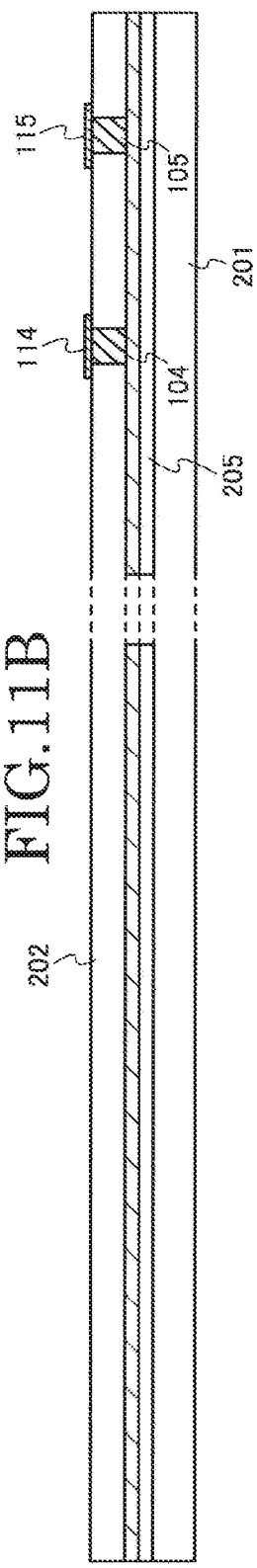
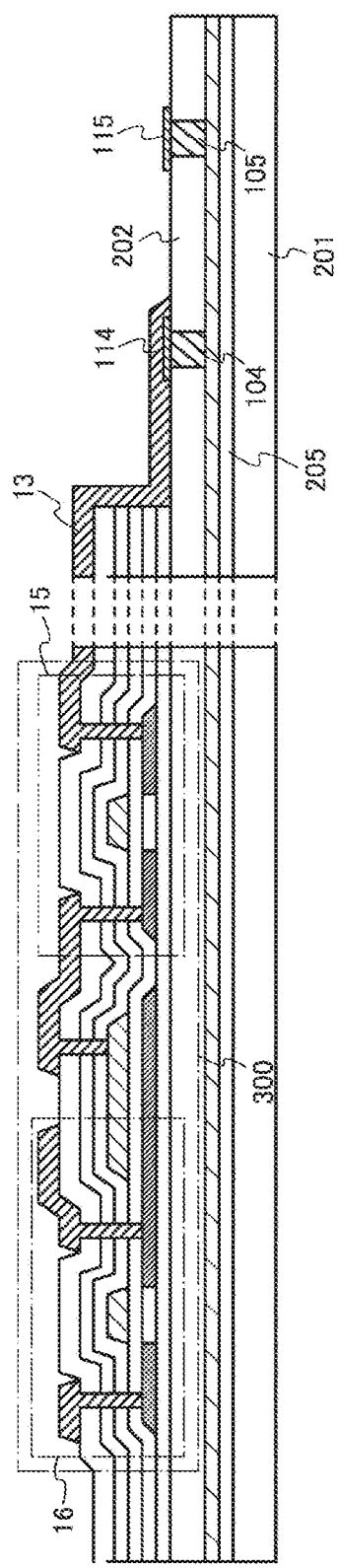

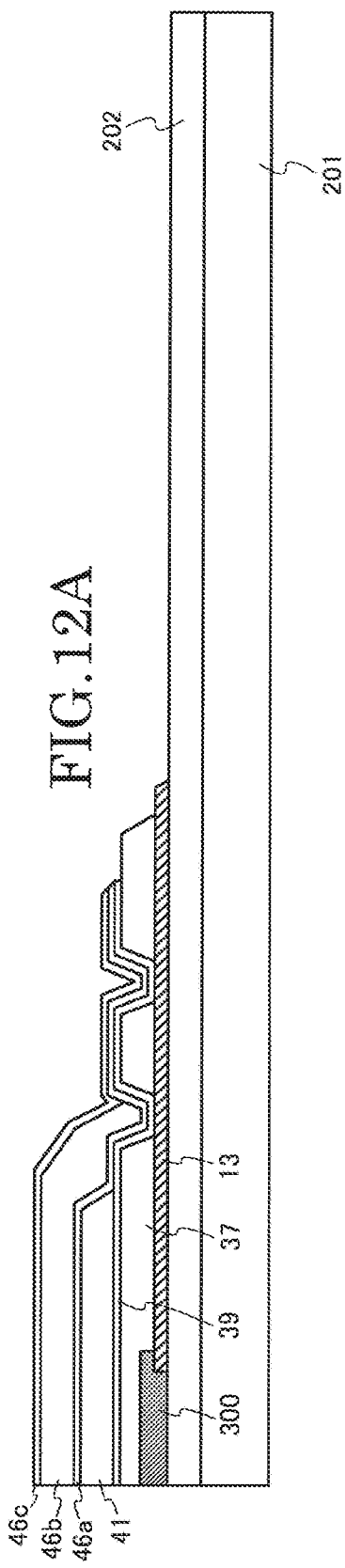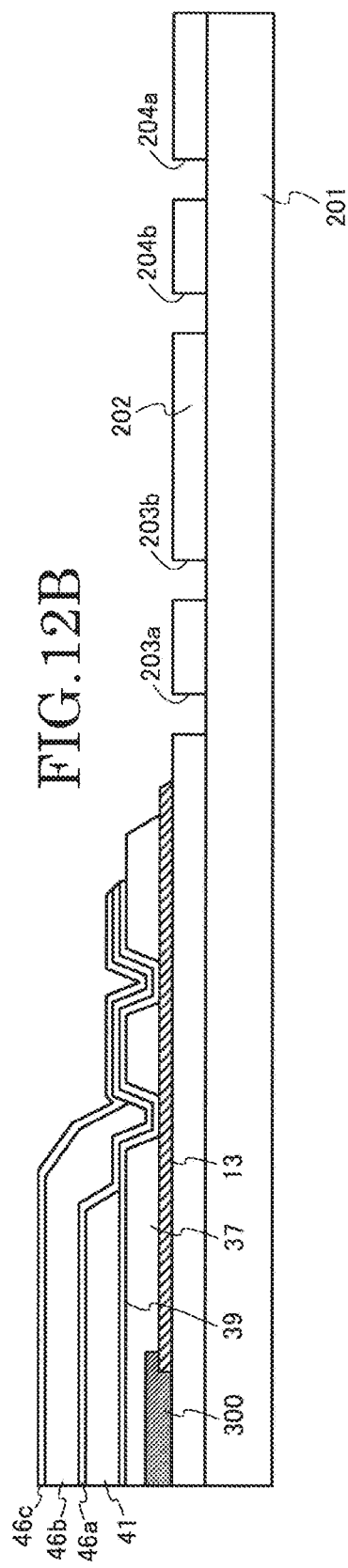

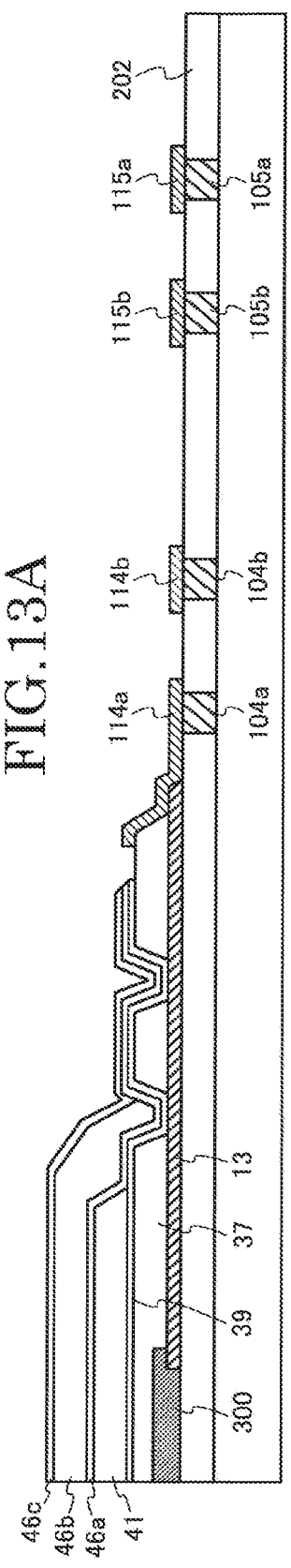
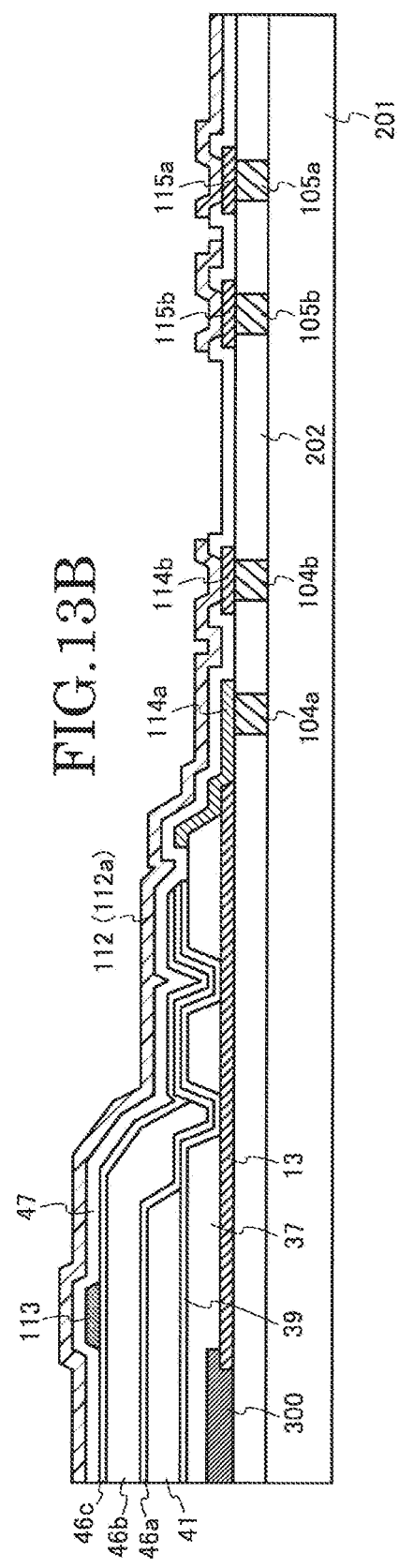

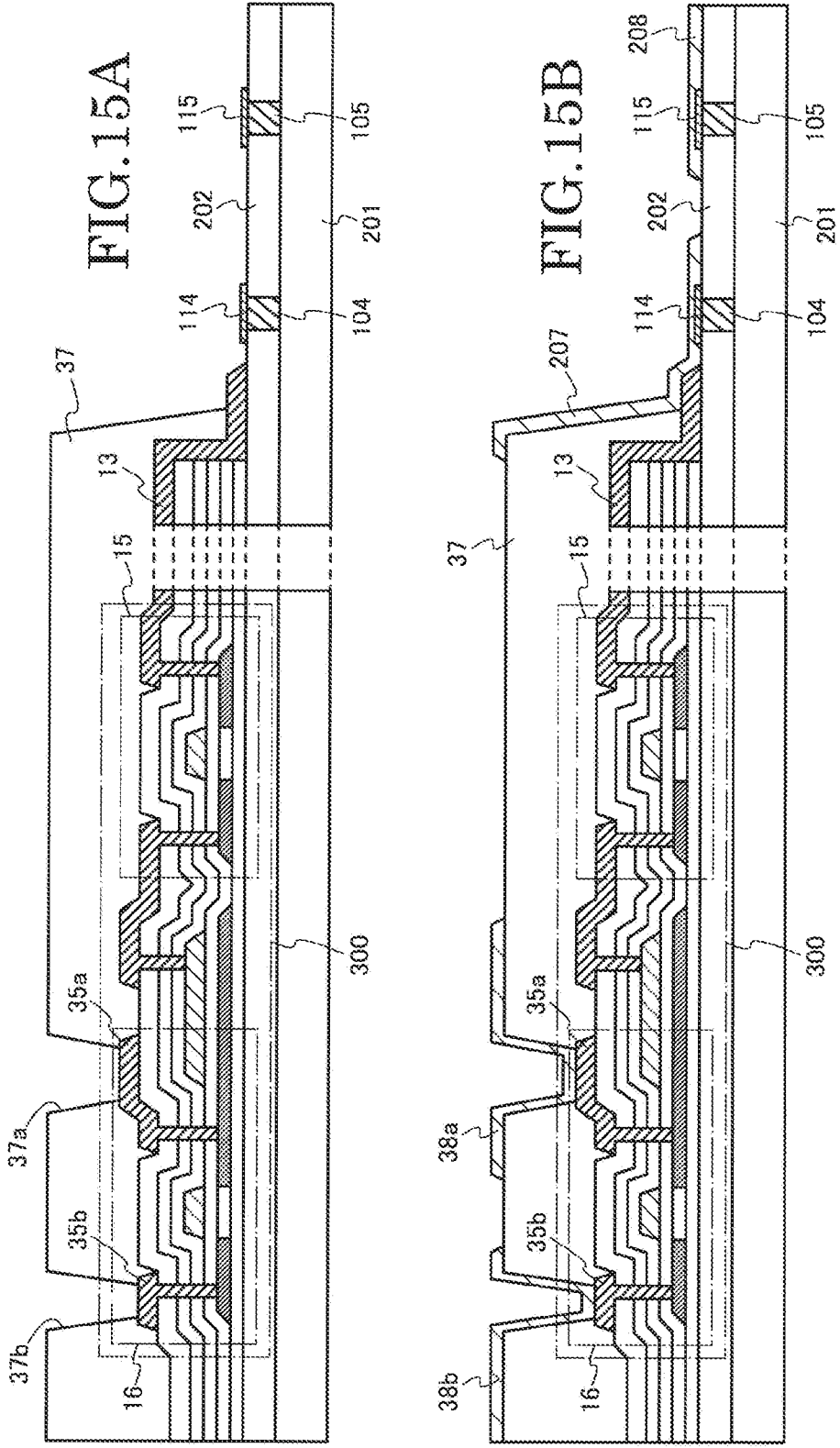

DISPLAY DEVICE AND METHOD FOR MANUFACTURING THE SAME

CROSS REFERENCE TO RELATED APPLICATIONS

This application is based on and claims the benefit of priority from the prior Japanese Patent Application No. 2019-002589, filed on Jan. 10, 2019, the entire contents of which are incorporated herein by reference.

FIELD

One embodiment of the present invention is related to a display device having a flexibility.

BACKGROUND

Recently, development of a display device including a film substrate formed of a resin material and a display circuit located on the film substrate has been advanced. The film substrate has a flexibility. Therefore, a display device including the film substrate is bendable. A technology that uses this property to curve an end of the display device to narrow a peripheral portion of a display portion is paid attention. For example, United States Patent Application No 2016/0172428 discloses a technology by which a display device is curved at a position between a display portion and a terminal portion connected with the display portion to bend the terminal portion toward the back of the display portion. According to the technology described in United States Patent Application No 2016/0172428, electronic components such as a COF (Chip on Film) and the like located in the terminal portion are located on the back of the display portion, and therefore, an edge portion (also referred to as a "frame" or a "bezel") of a casing accommodating the display device may be narrowed.

SUMMARY

A display device in an embodiment according to the present invention includes a flexible substrate; a display portion provided on a first surface of the flexible substrate and including a plurality of pixels; a first penetrating wiring located to penetrate the flexible substrate; and a second penetrating wiring located to penetrate the flexible substrate at a position farther from the display portion than the first penetrating wiring. The flexible substrate includes a curved portion between the first penetrating wiring and the second penetrating wiring, and the first penetrating wiring and the second penetrating wiring are electrically connected with each other without being extended on the curved portion.

A method for manufacturing a display device in an embodiment according to the present invention includes forming a resin layer on a support substrate; forming a first through-hole and a second through-hole in the resin layer; forming a first penetrating wiring in the first through-hole and forming a second penetrating wiring in the second through-hole; forming a display circuit including a plurality of semiconductor elements on a first surface of the resin layer; and releasing the resin layer from the support substrate, and then curving the resin layer at a position between the first penetrating wiring and the second penetrating wiring to electrically connect the first penetrating wiring and the second penetrating wiring to each other.

A method for manufacturing a display device in an embodiment according to the present invention includes forming a resin layer on a support substrate; forming a display circuit including a plurality of semiconductor elements on a first surface of the resin layer; forming a first through-hole and a second through-hole in the resin layer; forming a first penetrating wiring in the first through-hole and forming a second penetrating wiring in the second through-hole; and releasing the resin layer from the support substrate, and then curving the resin layer at a position between the first penetrating wiring and the second penetrating wiring to electrically connect the first penetrating wiring and the second penetrating wiring to each other.

BRIEF DESCRIPTION OF DRAWINGS

FIG. 10A shows a method for manufacturing the display device in embodiment 1;

FIG. 10B shows the method for manufacturing the display device in embodiment 1;

FIG. 10C shows the method for manufacturing the display device in embodiment 1;

FIG. 11A shows a modified method for manufacturing the display device in embodiment 1;

FIG. 11B shows the modified method for manufacturing the display device in embodiment 1;

FIG. 11C shows the modified method for manufacturing the display device in embodiment 1;

FIG. 12A shows a method for manufacturing a display device in embodiment 2;

FIG. 12B shows the method for manufacturing the display device in embodiment 2;

FIG. 13A shows the method for manufacturing the display device in embodiment 2;

FIG. 13B shows the method for manufacturing the display device in embodiment 2;

FIG. 15A shows the modified method for manufacturing the display device in embodiment 2; and FIG. 15B shows the modified method for manufacturing the display device in embodiment 2.

DESCRIPTION OF EMBODIMENTS

Figure 1:
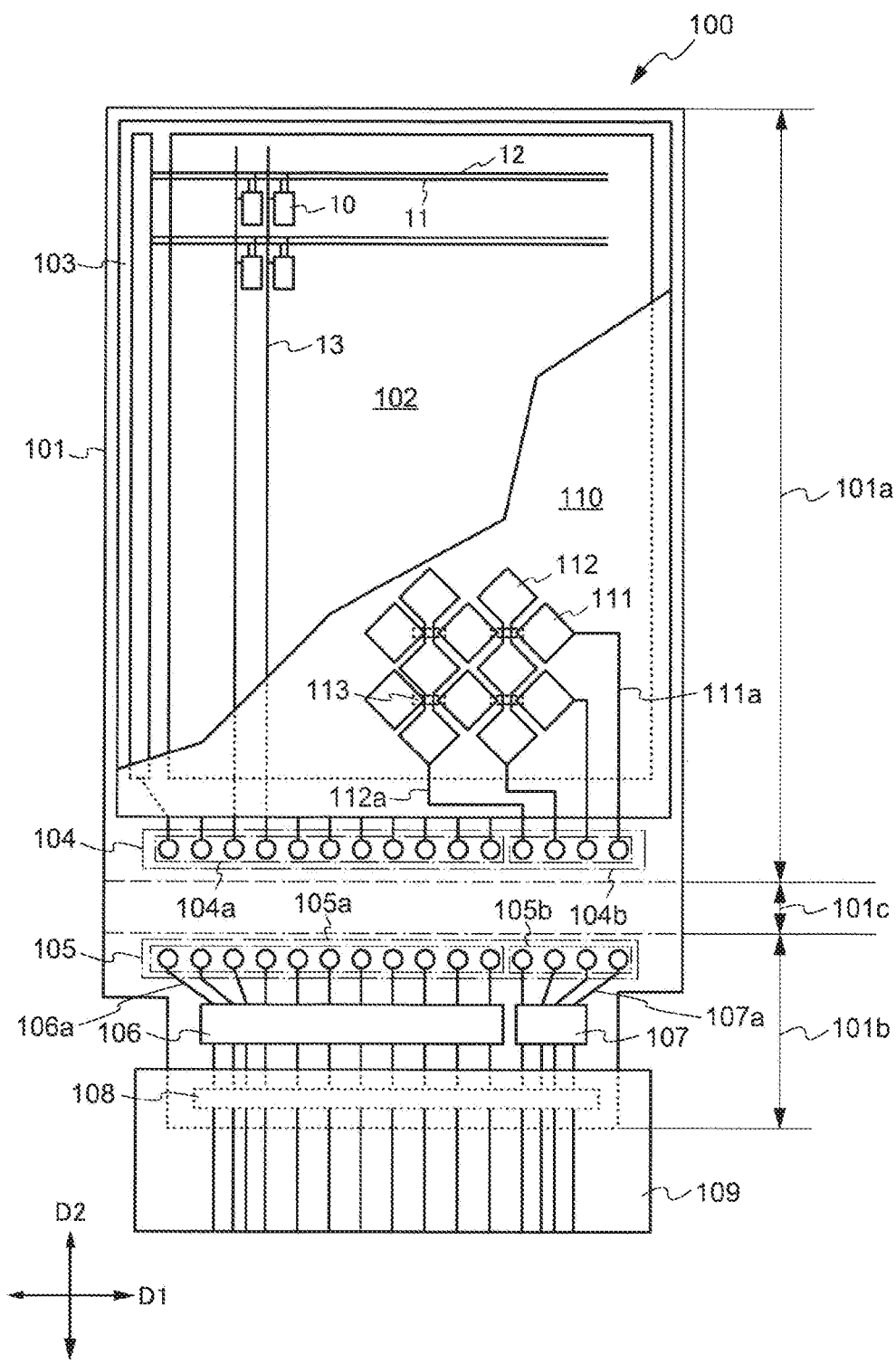
FIG. 1 is a plan view showing a structure of a display device in embodiment 1.

According to the technology described in United States Patent Application No 2016/0172428, a wiring that connects the display portion and the terminal portion to each other is bent along the substrate in the curved portion. Therefore, a stress is applied to the bent wiring, which may cause an inconvenience that the substrate is cracked or the wiring is disconnected. Such an inconvenience may undesirably cause a problem that a signal required for display is not provided and an image is not displayed.

One object of an embodiment of the present invention is to improve the reliability of a display device having a flexibility.

Hereinafter, embodiments of the present invention will be described with reference to the drawings and the like. The present invention may be carried out in various forms without departing from the gist thereof, and is not to be construed as being limited to any of the following embodiments. In the drawings, components may be shown schematically regarding the width, thickness, shape and the like, instead of being shown in accordance with the actual sizes, for the sake of clearer illustration. The schematic drawings are merely examples and do not limit the interpretations of the present invention in any way. In the specification and the drawings, components that have substantially the same functions as those described before with reference to a previous drawing(s) bear the identical reference signs thereto, and detailed descriptions thereof may be omitted.

In the specification and the claims, the terms "on", "above", "upward", "below" and "downward" each represent a relative position with respect to a surface of a substrate on which a display element is formed (hereinafter, such a surface will be referred to as a "first surface). For example, in this specification, a direction from the surface of the substrate toward the display element (e.g., light emitting element) will be referred to as "upward", and an opposite direction thereto will be referred to as "downward". In the specification and the claims, an expression that a component is "on" another component encompasses a case where such a component is in contact with the another component and also a case where such a component is above or below the another component, namely, a case where still another component is provided between such a component and the another component, unless otherwise specified.

In the case where a thin film formed on a substrate is processed to form a plurality of thin film patterns, these thin film patterns may have different functions or roles. However, the plurality of thin film patterns are formed of the thin film formed in the same step, and are formed of the same material or have the same layer structure. Therefore, the plurality of thin film patterns are defined as being present in the same layer. For example, in the case where a plurality of wirings are in the same layer, these wirings are formed by processing a thin film in the same step, and have the same stack structure and are formed of the same material.

Embodiment 1

<Structure of the Display Device>

With reference to FIG. 1 through FIG. 8, FIG. 9A, FIG. 9B, FIG. 10A and FIG. 10B, a display device 100 in embodiment 1 according to the present invention will be described. In this embodiment, an organic EL display device will be described as the display device 100.

FIG. 1 is a plan view showing a structure of the display device 100 in embodiment 1. FIG. 1 is a schematic plan view of a display portion 102 including a plurality of pixels 10. In this specification and the like, a view of the display device 100 as seen in a direction perpendicular to a front surface of a screen (display portion 102) will be referred to as a "plan view". It should be noted that FIG. 1 shows a state in which the display device 100 is not bent, for the sake of convenience. In actuality, an end of the display device 100 is bent. A specific structure thereof will be described below.

As shown in FIG. 1, the display device 100 in this embodiment includes a flexible substrate 101, and a display portion 102 a gate driving circuit 103, first penetrating wirings 104, second penetrating wirings 105, a driving circuit IC chip 106, a sensor IC chip 107, a terminal portion 108, a flexible printed circuit board 109, and a touch sensor 110 provided on a first surface (front surface) of the substrate 101. The driving circuit IC chip 106, the sensor IC chip 107 and the touch sensor 110 are not indispensable for the display device 100, and may be omitted.

The flexible substrate 101 is formed of a resin material. Such a resin substrate may be formed by, for example, forming a resin layer to have a predetermined thickness on a support substrate and then releasing the support substrate from the resin layer. In this embodiment, the resin material used to form the substrate 101 is polyimide. Alternatively, the substrate 101 may be formed of another resin material. Among surfaces of the substrate 101, a surface on which a display element (in this embodiment, a light emitting element) is to be formed is defined as the "first surface". Among the surfaces of the substrate 101, a surface opposite to the first surface is defined as a "second surface". Namely, the front surface of the substrate 101 is the first surface, and a rear surface of the substrate 101 is the second surface.

The display portion 102 includes the plurality of pixels 10 located in an array, a plurality of scanning signal lines 11 extending in a first direction (D1 direction), a plurality of power source signal lines 12 extending in the first direction, and a plurality of data signal lines 13 extending in a second direction (D2 direction) crossing the first direction. The plurality of pixels 10 each include a pixel circuit 10a therein. The pixel circuit 10a of each pixel 10 is connected with the corresponding scanning signal line 11, the corresponding power source signal line 12 and the corresponding data signal line 13.

<Structure of the Pixel Circuit>

Figure 2:
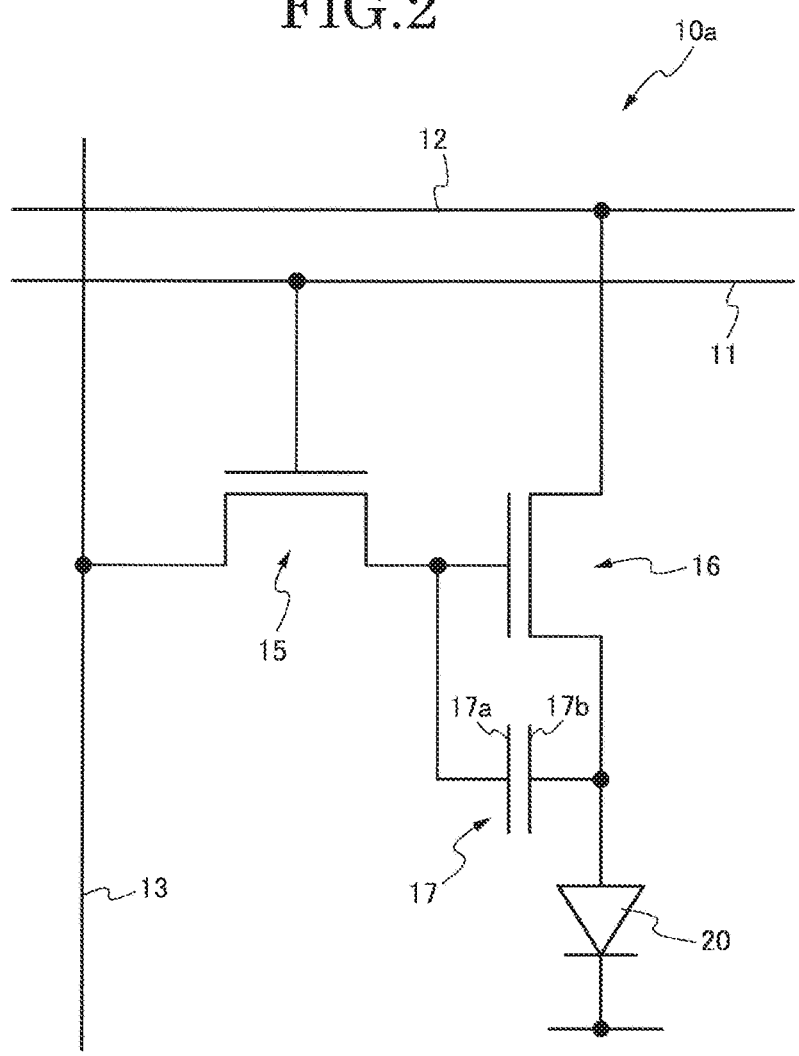
FIG. 2 shows a structure of a pixel circuit included in each of pixels in the display device in embodiment 1.

FIG. 2 shows a structure of the pixel circuit 10a located in each pixel of the display device 100 in embodiment 1. One pixel circuit 10a includes a selection transistor 15, a driving transistor 16, and a storage capacitance 17 as basic circuit elements. Each pixel circuit 10a is connected with a light emitting element 20. In this embodiment, an organic EL element is used as the light emitting element 20. The selection transistor 15 and the driving transistor 16 are each formed of, specifically, a semiconductor element such as a thin film transistor or the like. The storage capacitance 17 includes a pair of metal thin films and an insulating layer located between the pair of metal thin films. A specific structure of the driving transistor 16 and the like will be described below.

As shown in FIG. 2, a source of the selection transistor 15 is connected with the data signal line 13. A gate of the selection transistor 15 is connected with the scanning signal line 11. A drain of the selection transistor 15 is connected with a gate of the driving transistor 16 and a first electrode 17a included in the storage capacitance 17. The roles of the source and the drain are exchanged in accordance with a signal that is input to the data signal line 13. A drain of the driving transistor 16 is connected with the power source signal line 12. A source of the driving transistor 16 is connected with a second electrode 17b included in the storage capacitance 17 and an anode of the light emitting element 20. A cathode of the light emitting element 20 is kept at a potential lower than a potential supplied to the power source signal line 12.

In the pixel circuit 10a shown in FIG. 2, a data signal supplied to the data signal line 13 is written to the gate of the driving transistor 16 and the storage capacitance 17 by an on/off operation of the selection transistor 15. In a light emission period, the driving transistor 16 causes an electric current to flow in accordance with the potential supplied to the gate thereof to cause the light emitting element 20 to emit light. In this manner, in the pixel circuit 10a shown in FIG. 2, the operation of the driving transistor 16 is controlled in accordance with the data signal supplied to the data signal line 13, and thus the light emission of the light emitting element 20 is controlled.

In this embodiment, the selection transistor 15 is a p-channel thin film transistor, whereas the driving transistor 16 is an n-channel thin film transistor. Needless to say, the structure of the pixel circuit 10a is not limited to the structure shown in FIG. 2.

As described above, the display portion 102 in this embodiment includes the plurality of pixel circuit 10a located in an array and the plurality of signal lines (the scanning signal lines 11, the power source signal lines 12 and the data signal lines 13) provided to transmit a signal to the plurality of pixel circuit 10a. The pixel circuit 10a and the above-mentioned signal lines are included in a circuit that controls the light emission of the plurality of light emitting elements 20 (hereinafter, the circuit will be referred to as a "display circuit" (represented by reference sign 300 in FIG. 3 and the like)).

The touch sensor 110 is located on the display portion 102. FIG. 1 shows only a part of the touch sensor 110 for the sake of convenience. FIG. 1 shows a part of the display portion 102 and a part of the touch sensor 110. As seen in a plan view, the display portion 102 and the touch sensor 110 overlap each other in the entirety thereof. The touch sensor 110 includes a plurality of first sensor electrodes 111 extending in stripes in the first direction and a plurality of second sensor electrodes 112 extending in stripes in the second direction. The first sensor electrodes 111 and the second sensor electrodes 112 are also referred to as "transmission electrodes (Tx)" or "receiving electrodes (Rx)" in accordance with the roles thereof.

The first sensor electrodes 111 and the second sensor electrodes 112 are separate from each other, and are capacitively coupled with each other. When a finger of a human or the like touches the tough sensor 110 in this state, the value of the capacitive coupling between the first sensor electrodes 111 and the second sensor electrodes 112 is changed. The touch sensor 110 reads such a change in the capacitive coupling to determine the position at which the finger or the like has touched. Such a sensing system is referred to as a "projected capacitive system".

In this embodiment, the first sensor electrodes 111 and the second sensor electrodes 112 are formed of the same metal material and are present in the same layer. Therefore, at each of portions where the first sensor electrodes 111 and the second sensor electrodes 112 cross each other, two first sensor electrodes 111 adjacent to each other are electrically connected with each other by a connection wiring 113.

The first penetrating wirings 104 are located to penetrate from the first surface (also referred to as the "front surface") of the substrate 101 to the second surface (opposite to the first surface; also referred to as the "rear surface") of the substrate 101. As shown in FIG. 1, the first penetrating wirings 104 are electrically connected with the gate driving circuit 103, the data signal lines 13, the first sensor electrodes 111 and the second sensor electrodes 112. In the following description, the first penetrating wirings 104 electrically connected with the gate driving circuit 103 or the data signal lines 13 will be referred to as "first penetrating wirings 104a". By contrast, the first penetrating wirings 104 electrically connected with the first sensor electrodes 111 or the second sensor electrodes 112 will be referred to as "first penetrating wirings 104b".

Like the first penetrating wirings 104, the second penetrating wirings 105 are located to penetrate from the first surface of the substrate 101 to the second surface of the substrate 101. As shown in FIG. 1, the second penetrating wirings 105 are electrically connected with the driving circuit IC chip 106 and the sensor IC chip 107. In the following description, the second penetrating wirings 105 electrically connected with the driving circuit IC chip 106 will be referred to as "second penetrating wirings 105a". By contrast, the second penetrating wirings 105 electrically connected with the sensor IC chip 107 will be referred to as "second penetrating wirings 105b".

In the display device 100 in this embodiment, the substrate 101 is curved to electrically connect the first penetrating wirings 104 and the second penetrating wirings 105 to each other. Specifically, an area between the first penetrating wirings 104 and the second penetrating wirings 105 is curved such that the first penetrating wirings 104 and the second penetrating wirings 105 overlap each other as seen in a plan view. In this specification, a portion of the substrate 101 that is curved will be referred to as a "curved portion". As shown in FIG. 1, the substrate 101 is divided into a first region 101a including the first penetrating wirings 104, a second region 101b including the second first penetrating wirings 105, and a third region 101c held between the first region 101a and the second region 101b. In this case, the third region 101c corresponds to the curved portion.

In this embodiment, the first penetrating wirings 104 and the second penetrating wirings 105 are conductors (vias) formed of copper or a copper-containing alloy. The first penetrating wirings 104 and the second penetrating wirings 105 are not limited to being formed of such a material, and may be formed of any material that allows the first penetrating wirings 104 and the second penetrating wirings 105 to act as vias.

The driving circuit IC chip 106 and the sensor IC chip 107 are electrically connected with the terminal portion 108 provided on the substrate 101. The terminal portion 108 is connected with a flexible printed circuit board 109 via an anisotropic conductive film or the like (not shown). Various signals are transmitted to the display device 100 from an external circuit (not shown) via the flexible printed circuit board 109. In this embodiment, the driving circuit IC chip 106 and the sensor IC chip 107 are directly mounted on the substrate 101. The driving circuit IC chip 106 and the sensor IC chip 107 are not limited to being mounted in this manner. For example, electronic components such as the driving circuit IC chip 106, the sensor IC chip 107 and the like may be mounted on a resin substrate used to form the flexible printed circuit board 109.

<Structure of the Pixel>

Figure 3:
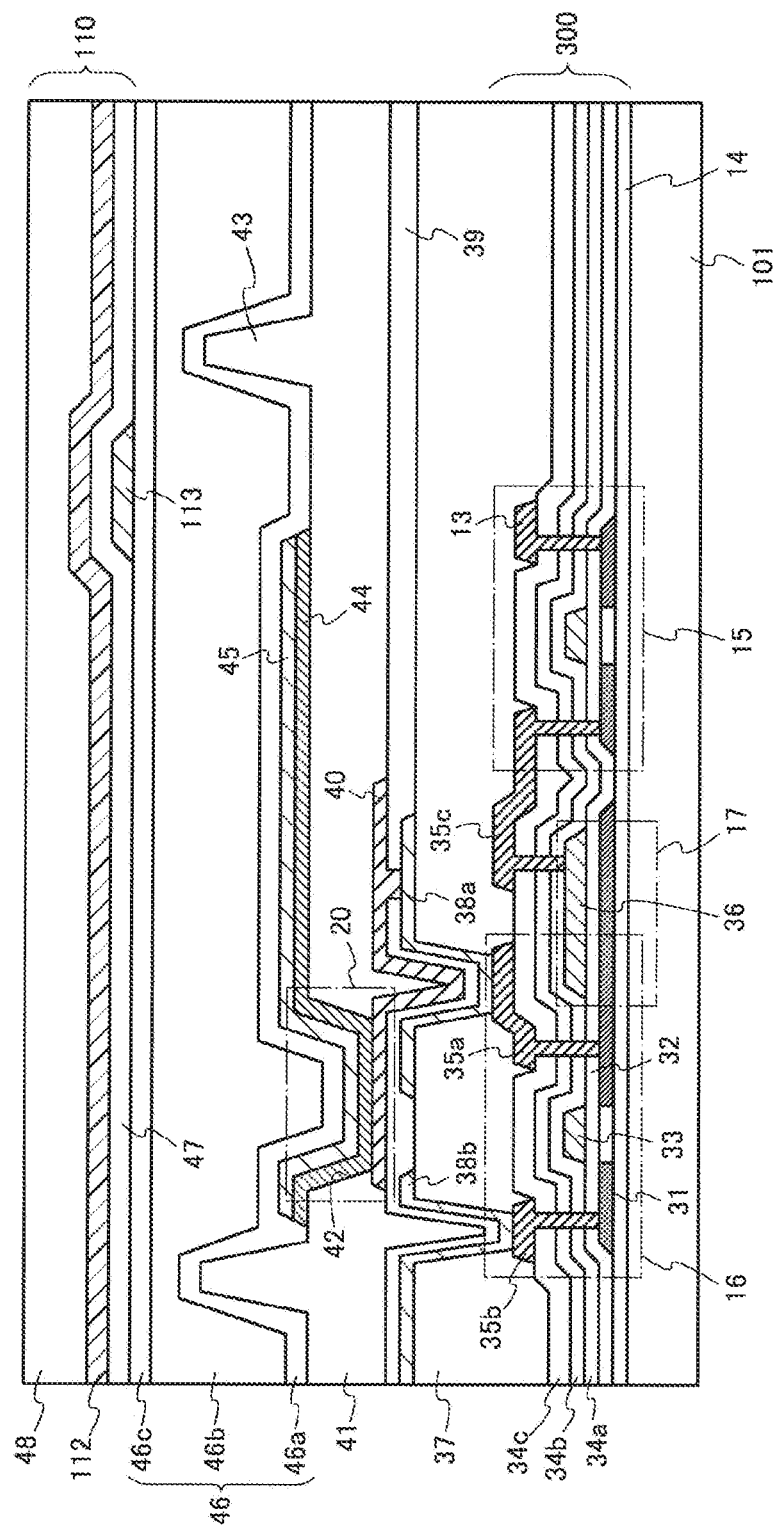
FIG. 3 is a cross-sectional view showing a structure of the pixel in the display device in embodiment 1.

Now, with reference to FIG. 3, a specific structure of the pixel 10 will be described. FIG. 3 is a cross-sectional view showing a structure of the pixel 10 in the display device 100 in embodiment 1. As shown in FIG. 3, the selection transistor 105 and the driving transistor 106 are provided on the substrate 101 via an underlying layer 14. In this embodiment, a resin substrate is used as the substrate 101. The resin substrate may be, for example, a polyimide substrate or an acrylic substrate. The underlying layer 14 is formed of an inorganic insulating film such as a silicon oxide film, a silicon nitride film, a silicon oxide nitride film or the like.

The selection transistor 15 and the driving transistor 16 shown in FIG. 3 are so-called top gate-type thin film transistors. The selection transistor 15 and the driving transistor 16 are not limited to being of this type, and may be any type of thin film transistors. The selection transistor 15 acts as a switching element that transmits a data signal to the pixel 10. As shown in FIG. 2, the selection transistor 15 is provided between the data signal line 13 and the storage capacitance 17. In actuality, one of nodes of the selection transistor 15 (e.g., source) is connected with the data signal line 13, and the other node of the selection transistor 15 (e.g., drain) is connected with the gate of the driving transistor 16 and the storage capacitance 17. The driving transistor 16 has a function of supplying an electric current to the light emitting element 20. As shown in FIG. 2, the driving transistor 16 is provided between the power source signal line 12 and the light emitting element 20.

The driving transistor 16 includes a semiconductor layer 31, a gate insulating layer 32 and a gate electrode 33 as basic components. On the gate electrode 33, an insulating layer 34a formed of silicon oxide, an insulating layer 34b formed of silicon nitride, and an insulating layer 34c formed of silicon oxide are stacked. On the insulating layer 34c, wirings 35a and 35b are provided. The wirings 35a and 35b are connected with the semiconductor layer 31 via contact holes formed in the insulating layers 34a through 34c. The wirings 35a and 35b are a source wiring or a drain wiring formed concurrently with the data signal lines 13. In this embodiment, the data signal lines 13 and the wirings 35a and 35b have a stack structure including two titanium layers and an aluminum layer held between the two titanium layers. The stack structure of the selection transistor 15 is the same as that of the driving transistor 16, and will not be described herein.

The storage capacitance 17 is formed of a plurality of layers used to form the selection transistor 15 and the driving transistor 16. Specifically, a part of the semiconductor layer 31 of the driving transistor 16 is used as one electrode of the storage capacitance 17, and a capacitance electrode 36 formed concurrently with the gate electrode 33 is used as the other electrode of the storage capacitance 17. Namely, the gate electrode 33 and the capacitance electrode 36 are present in the same layer. The storage capacitance 17 is not limited to having such a structure. As shown in FIG. 2 and FIG. 3, the capacitance electrode 36 acting as the other electrode of the storage capacitance 17 (the capacitance electrode 36 corresponds to the first electrode 17a in FIG. 2) is connected with the selection transistor 15 via the wiring 35c. The part of the semiconductor layer 31 acting as the one electrode of the storage capacitance 17 (the part of the semiconductor layer 31 corresponds to the second electrode 17b in FIG. 2) is connected with the driving transistor 16.

On the selection transistor 15 and the driving transistor 16, a flattening layer 37 is provided. The flattening layer 37 is an insulating layer containing a resin material such as acrylic resin, polyimide resin or the like. The flattening layer 37 has a function of flattening the surface roughness caused by the shapes of the selection transistor 15 and the driving transistor 16.

On the flattening layer 37, oxide conductive layers 38a and 38b are provided. In this embodiment, the oxide conductive layers 38a and 38b are formed by patterning a thin film formed of a metal oxide material such as ITO (Indium Tin Oxide), IZO (Indium Zinc Oxide), IGZO (Indium Gallium Zinc Oxide) or the like. The oxide conductive layers 38a and 38b are not limited to being formed of such a material, and may be formed of any other oxide conductive material. The oxide conductive layers 38a and 38b are connected with the driving transistor 16 via contact holes formed in the flattening layer 37. On the oxide conductive layers 38a and 38b, an insulating layer 39 is provided. In this embodiment, a silicon nitride layer is used as the insulating layer 39. The insulating layer 39 is not limited to being a silicon nitride layer, and may be a silicon oxide layer or a silicon oxide nitride layer.

On the insulating layer 39, a pixel electrode 40 is provided. The pixel electrode 40 is connected with the oxide conductive layer 38a via a contact hole formed in the insulating layer 39. Namely, the pixel electrode 40 is connected with the driving transistor 16 via the oxide conductive layer 38a. The pixel electrode 40 also acts as an anode electrode of the light emitting element 20.

In this embodiment, the pixel electrode 40 is formed of a conductive layer having a stack structure including oxide conductive layers and a silver-containing layer held between the oxide conductive layers. Specifically, the pixel electrode 40 includes an IZO layer, a silver layer and an IZO layer. Instead of the IZO layers, ITO layers are usable. For a structure in which light emitted by the light emitting element 20 is output upward, it is preferred that the pixel electrode 40 includes a light-reflective conductive layer. Therefore, in this embodiment, a part of the pixel electrode 40 is formed of a layer formed of a metal material containing silver or a silver alloy, which has a high light reflectance.

A part of the pixel electrode 40 is covered with a bank 41 formed of an organic material. Specifically, the bank 41 covers an end of the pixel electrode 40 and has an opening 42 exposing a part of a top surface of the pixel electrode 40. The exposed part of the top surface of the pixel electrode 40 (i.e., a region of the top surface of the pixel electrode 40 that is located in the opening 42) is a substantial light emitting region of the pixel 10. Namely, the bank 41 has a role of demarcating the light emitting region of the pixel 10. The organic material used to form the bank 41 may be a resin material such as acrylic resin, polyimide resin or the like, but is not limited to any of these.

In this embodiment, spacers 43 are provided on the bank 41. The spacers 43 may be formed of the same material as that of the bank 41 or a different material from that of the bank 41. The spacers 43 are used to provide a gap between a vapor deposition mask (not shown) and the bank 41 for forming a light emitting layer 44 by use of a vapor deposition device. Needless to say, the spacers 43 may be provided when necessary, and may be omitted.

On a region, of the top surface of the pixel electrode 40, that does not overlap the bank 41 (i.e., region in the opening 42), the light emitting layer 44 is provided. The light emitting layer 44 may be formed of an organic EL material that emits, for example, red, blue or green light. In FIG. 3, only the light emitting layer 44 is shown. In addition to the light emitting layer 44, an electron injection layer, an electron transfer layer, an electron blocking layer, a hole injection layer, a hole transfer layer, and/or a hole blocking layer may be provided on the region in the opening 42. In such a case, the functional layers such as the electron injection layer, the electron transfer layer, the electron blocking layer, the hole injection layer, the hole transfer layer and the hole blocking layer may be provided over a plurality of pixels.

On the light emitting layer 44, a common electrode 45 formed of a conductive layer containing a group I element or a group II element. Such a conductive layer may be formed of, for example, a magnesium (Mg) film, a lithium (Li) film or the like. In this embodiment, a layer of MgAg, which is an alloy of magnesium and silver, is used as the conductive layer containing a group II element. The common electrode 45 acts as a cathode electrode of the light emitting element 20. In FIG. 3, the common electrode 45 appears to be provided for each pixel 10. In actuality, however, the common electrode 45 is provided over a plurality of pixels 10.

In the case where the display device 100 is of a top emission type, in which light from the light emitting layer 44 is output upward, namely, is extracted on the side of the common electrode 45, the common electrode 45 needs to be light-transmissive. In the case where the common electrode 45 is formed of a conductive layer containing a group I element or a group II element as described above, the common electrode 45 is made sufficiently thin to be transmissive for the light emitted from the light emitting layer 44. Specifically, the common electrode 45 may have a thickness of 10 nm or greater and 30 nm or less so as to be light-transmissive.

The light emitting element 20 includes the pixel electrode 40, the light emitting layer 44 and the common electrode 45. As shown in FIG. 2, the light emitting element 20 is connected in series to the driving transistor 16.

On the common electrode 45 (i.e., on the light emitting element 20), a sealing layer 46 is provided. The sealing layer 46 in this embodiment includes three layers, more specifically, a first sealing layer 46a formed of an inorganic material, a second sealing layer 46b formed of an organic material, and a third sealing layer 46c formed of an inorganic material. The sealing layer 46 plays a role of preventing invasion of moisture or the like from outside to prevent deterioration of the light emitting layer 44 and the common electrode 45.

In this embodiment, a silicon nitride layer is used as each of the first sealing layer 46a and the third sealing layer 46c. The first sealing layer 46a and the third sealing layer 46c are not limited to be such a layer, and may be a silicon oxide layer or a silicon oxide nitride layer instead of the silicon nitride layer. Namely, the first sealing layer 46a and the third sealing layer 46c may each be an inorganic insulating layer. It is especially preferred that the inorganic insulating layer is an insulating layer containing silicon nitride.

In this embodiment, an organic insulating layer formed of a resin material is used as the second sealing layer 46b. In this embodiment, an organic insulating layer formed of a resin material may be used as the second sealing layer 46b, so that the surface roughness caused by the bank 41 and the spacers 43 is flattened. The first sealing layer 46a has a thickness of about 1 μm, and therefore, is formed on inclining surfaces of the bank 41 and the spacers 43. By contrast, the second sealing layer 46b has a thickness of about 10 μm, and therefore, buries the steps caused by the bank 41 and the spacers 43. In this manner, use of an organic insulating layer as the second sealing layer 46b makes the surface roughness caused to a top surface of the second sealing layer 46b smaller than the surface roughness caused to a top surface of the first sealing layer 46a.

The display device 100 in this embodiment further includes the tough sensor 110 on the sealing layer 46. As shown in FIG. 1, the tough sensor 110 includes the first sensor electrodes 111, the second sensor electrodes 112 and the connection wirings 113. As shown in FIG. 3, the connection wiring 113 is provided on the sealing layer 46. The connection wiring 113 is covered with an insulating layer 47 formed of silicon nitride. On the insulating layer 47, the second sensor electrode 112 is provided. Although not shown in FIG. 3, the first sensor electrode 111 extends in a direction generally perpendicular to the second sensor electrode 112.

On the touch sensor 110, a protection layer 48 is provided. In this embodiment, a layer formed of a resin material is used as the protection layer 48. The protection layer 48 is not limited to be such a layer. For example, a protection film or cover glass may be bonded with an adhesive.

<Structure of the Penetrating Wiring>

Now, a connection structure of the first penetrating wirings 104 and the second penetrating wirings 105 will be described. In the display device 100 in this embodiment, the display portion 102, the gate driving circuit 103 and the touch sensor 110 are electrically connected with the driving circuit IC chip 106 and the sensor IC chip 107 via the first penetrating wirings 104 and the second penetrating wirings 105.

Figure 4:
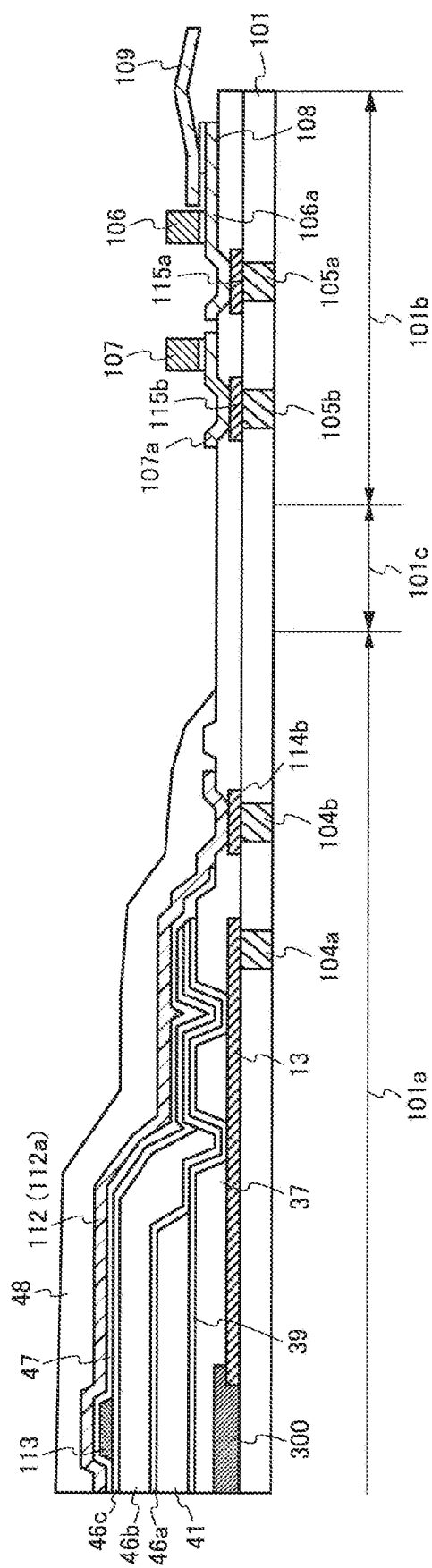
FIG. 4 is a cross-sectional view showing a structure of the display device before bending in embodiment 1.
Figure 5:
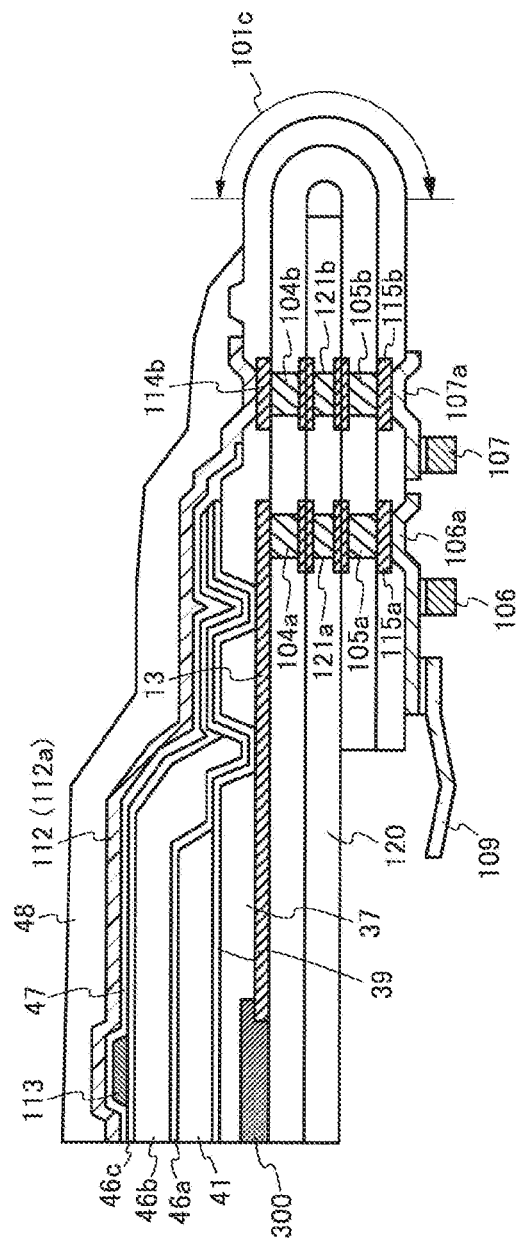
FIG. 5 is a cross-sectional view showing a structure of the display device after bending in embodiment 1.

FIG. 4 is a cross-sectional view showing a structure of the display device 100 in embodiment 1 in a pre-bending state. The structure of the display device 100 shown in FIG. 4 is of the same state as that of the display device 100 shown in FIG. 1 (namely, in a state where the substrate 101 is extended). It should be noted that FIG. 4 omits a spacer 105 shown in FIG. 5 for the sake of convenience. By contrast, FIG. 5 shows a structure of the display device 100 in embodiment 1 in a post-bending state. The display device 100 in this embodiment actually has the structure shown in FIG. 5. In FIG. 4 and FIG. 5, components that are common to those shown in FIG. 3 will bear the identical reference signs thereto and descriptions thereof will be omitted.

First, FIG. 1 and FIG. 4 will be referred to. In FIG. 1 and FIG. 4, the first penetrating wirings 104a, the first penetrating wirings 104b, the second penetrating wirings 105a and the second penetrating wirings 105b are located to penetrate the substrate 101. For example, the first penetrating wirings 104a, the first penetrating wirings 104b, the second penetrating wirings 105a and the second penetrating wirings 105b may be formed by providing through-holes in the substrate 101 formed of a resin material and filling the through-holes with a metal material.

As shown in FIG. 1 and FIG. 4, some of the first penetrating wirings 104a are each electrically connected with the corresponding data signal line 13 extending from the display circuit 300. In this embodiment, an end of the data signal line 13 overlaps the first penetrating wiring 104a to act as a land electrode. A "land electrode" is a terminal electrode provided to electrically connect a penetrating wiring and another wiring to each other with certainty. The land electrode is not limited to being provided in this manner. A land electrode may be located on the first penetrating wiring 104a separately from the data signal line 13 and may be connected with the display circuit 300 by a wiring. In the example shown in FIG. 4, the data signal line 13 also acts as a land electrode, and therefore, the land electrode has a stack structure including two titanium layers and an aluminum layer held between the two titanium layers. The land electrode is not limited to having such a structure.

FIG. 4 omits a specific structure of the display circuit 300. The specific structure of the display circuit 300 is described above with reference to FIG. 1 and FIG. 3. Namely, the display circuit 300 includes the plurality of pixel circuits 10a, the plurality of scanning signal lines 11, the plurality of power source lines 12 and the plurality of data signal lines 13. As shown in FIG. 1, the first penetrating wiring 104a is also electrically connected with the gate driving circuit 103.

Some of the first penetrating wirings 104b are electrically connected with the first sensor electrodes 111 via connection wirings 111a. As shown in FIG. 1, the remaining first penetrating wirings 104b are electrically connected with the second sensor electrodes 112 via connection wirings 112a. Namely, the first penetrating wirings 104b are electrically connected with the touch sensor 110 via the connection wirings 111a and 112a. In this embodiment, the first sensor electrodes 111 and the second sensor electrodes 112 are partially extended to be used as the connection wirings 111a and the connection wirings 112a. The connection wirings 111a and the connection wirings 112a are not limited to being provided in this manner, and may be provided as separate wirings that connect the first penetrating wirings 104b with the first sensor electrodes 111 or the second sensor electrodes 112.

The second penetrating wirings 105a are electrically connected with the driving circuit IC chip 106 via connection wirings 106a. The second penetrating wirings 105b are electrically connected with the sensor IC chip 107 via connection wirings 107a. In this embodiment, the connection wirings 106a and the connection wirings 107a are formed concurrently with the connection wirings 111a. The connection wirings 106a and the connection wirings 107a are not limited to being formed in this manner. In the example shown in FIG. 4, an end of the connection wiring 106a forms the terminal portion 108, and the terminal portion 108 is connected with the flexible printed circuit board 109. The electrical connection of the driving circuit IC chip 106/the sensor IC chip 107 and the flexible printed circuit board 109 may be provided by wirings other than the connection wirings 106a or the connection wirings 107a.

In this embodiment, each of the second penetrating wirings 105a is connected with the driving circuit IC chip 106 via the connection wiring 106a. Alternatively, the driving circuit IC chip 106 may be directed mounted on a land electrode 115a on the second penetrating wiring 105a. Similarly, the sensor IC chip 107 may be directly mounted on a land electrode 115b on each of the second penetrating wirings 105b in order to connect the second penetrating wiring 105b with the sensor IC chip 107.

Now, with reference to FIG. 5, the structure of the display device 100 in the post-bending state will be described. The display device 100 in this embodiment has the following structure. Referring to FIG. 4, the third region 101c is curved to cause the second surfaces (rear surfaces) to face each other.

During this process, in this embodiment, the spacer 120 is provided between the first region 101a and the second region 101b.

The spacer 120 includes third penetrating wirings 121a and 121b located to penetrate the spacer 120. Therefore, the first penetrating wiring 104a and the second penetrating wiring 105a are electrically connected with each other via the third penetrating wiring 121a. Similarly, the first penetrating wiring 104b and the second penetrating wiring 105b are electrically connected with each other via the third penetrating wiring 121b. In the following description, in the case where there is no need to distinguish the third penetrating wiring 121a and the third penetrating wiring 121b from each other, the third penetrating wiring 121a and the third penetrating wiring 121b may be collectively referred to as the "third penetrating wiring 121".

The spacer 120 may be formed of, for example, a glass substrate, a ceramic substrate or a resin substrate of a polyimide resin, an acrylic resin or an epoxy resin. It is preferred to use a material having a coefficient of thermal expansion that is equal to, or close to, the coefficient of thermal expansion of a material used to form the substrate 101 in order to suppress generation of a stress as much as possible.

As described above, in this embodiment, the display device 100 includes the curved portion (corresponding to the third region 101c), and the first penetrating wirings 104 and the second penetrating wirings 105 are electrically connected with each other without being extended on the curved portion of the substrate 101. Namely, the display circuit 300 or the touch sensor 110 is electrically connected with the driving circuit IC chip 106 or the sensor IC chip 107 without being extended on the curved portion of the substrate 101. This prevents an inconvenience that a wiring influenced by a stress causes a crack, or is disconnected, in the curved portion of the substrate 101. As a result, the reliability of the display device 100 having a flexibility is improved.

Figure 6:
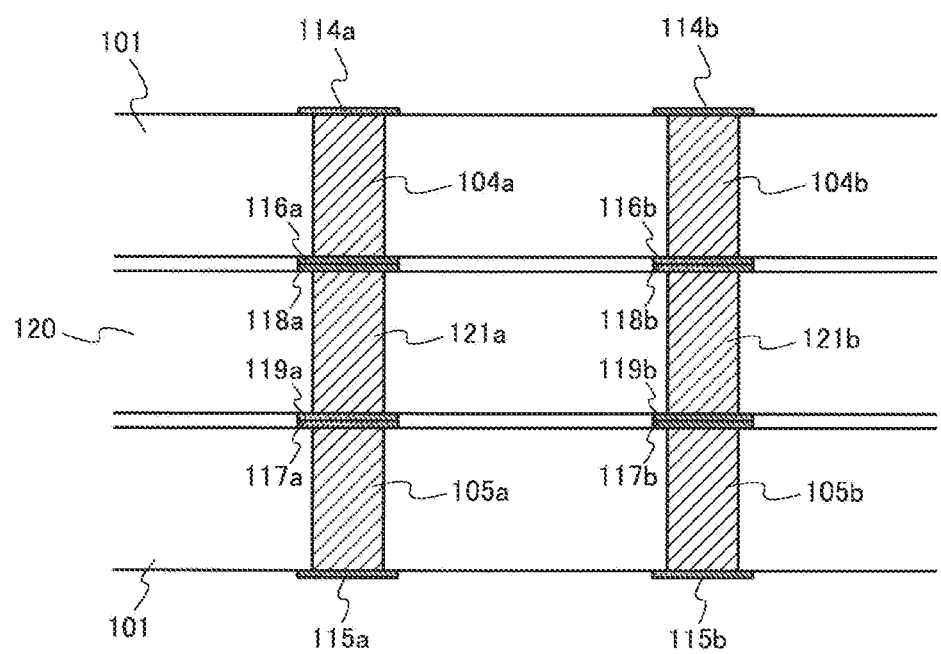
FIG. 6 is an enlarged cross-sectional view showing a connection part of penetrating wirings in the display device in embodiment 1.

Now, an example of connection structure of the first penetrating wirings 104, the second penetrating wirings 105 and the third penetrating wirings 121 will be described. FIG. 6 is an enlarged cross-sectional view of a connection part of the penetrating wirings in the display device 100 in embodiment 1.

As shown in FIG. 6, both of two ends of the first penetrating wiring 104a located on the substrate 101 are respectively connected with land electrodes 114a and 116a. Both of two ends of the first penetrating wiring 104b are respectively connected with land electrodes 114b and 116b. Similarly, both of two ends of the second penetrating wiring 105a located on the substrate 101 are respectively connected with land electrodes 115a and 117a. Both of two ends of the second penetrating wiring 105b are respectively connected with land electrodes 115b and 117b. Both of two ends of the third penetrating wiring 121a located in the spacer 120 are respectively connected with land electrodes 118a and 119a. Both of two ends of the third penetrating wiring 121b are respectively connected with land electrodes 118b and 119b.

In the example shown in FIG. 6, the land electrode 116a and the land electrode 118a are directly connected with each other. For example, the land electrode 116a and the land electrode 118a may be crimped while being supplied with heat and pressure to bond surfaces of the land electrode 116a and the land electrode 118a to each other. It is preferred that the surfaces of the land electrode 116a and the land electrode 118a are treated with plasma beforehand to be activated. In addition, a thin solder layer may be provided on each of the surfaces of the land electrode 116a and the land electrode 118a. Similarly, the land electrode 116b and the land electrode 118b, the land electrode 117a and the land electrode 119a, and the land electrode 117b and the land electrode 119b are directly connected with each other.

As described above, in this embodiment, the land electrodes are directly connected with each other, and therefore, the gap between the substrate 101 and the spacer 120 is shortened. In actuality, since the substrate 101 is formed of a soft resin material, and therefore, there is substantially no gap between the substrate 101 and the spacer 120. Therefore, according to this embodiment, the display device 100 is suppressed from increasing in the thickness, and the display device 100 is realized to be thin and compact.

Figure 7:
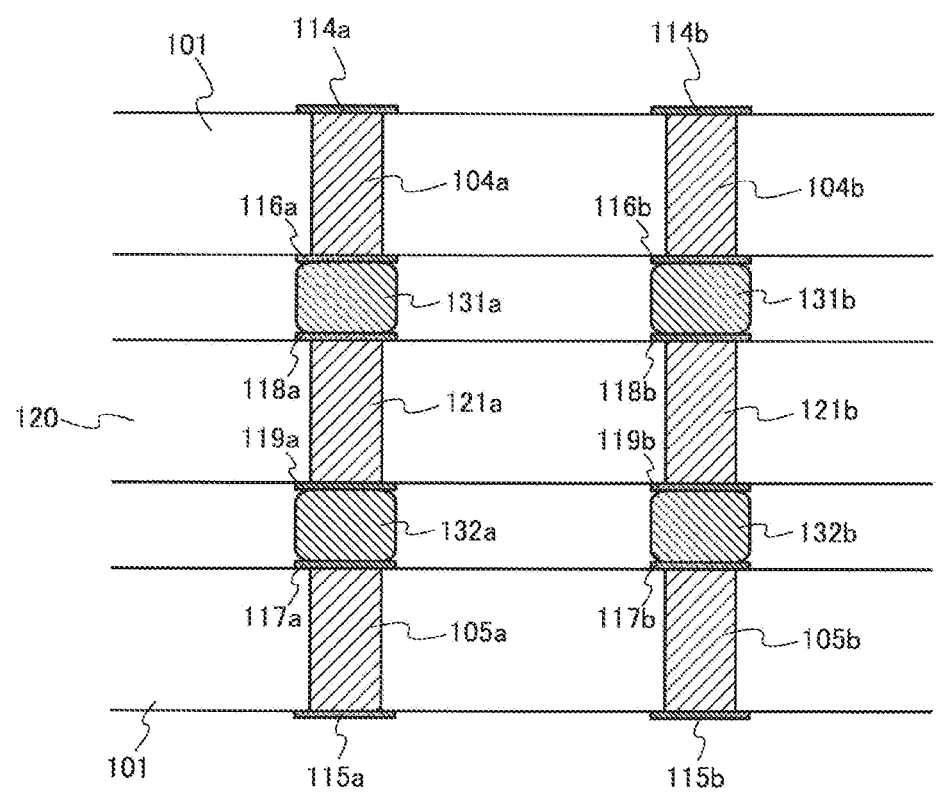
FIG. 7 is an enlarged cross-sectional view showing a connection part of penetrating wirings in a modified display device in embodiment 1.

The connection structure of the penetrating wirings in this embodiment is not limited to the structure shown in FIG. 6. For example, the land electrodes may be indirectly connected with each other via an adhesive. FIG. 7 is an enlarged cross-sectional view of a connection part of the penetrating wirings in a modification of the display device 100 in embodiment 1. Specifically, in the example show in FIG. 7, the land electrodes are connected with each other via a solder ball or an adhesive such as an anisotropic conductive film or the like.

As shown in FIG. 7, a conductive body 131a is provided between the land electrode 116a on the first penetrating wiring 104a and the land electrode 118a on the third penetrating wiring 121a. The conductive body 131a is, for example, a solder ball or an anisotropic conductive film. A conductive body 131b is provided between the land electrode 116b on the first penetrating wiring 104b and the land electrode 118b on the third penetrating wiring 121b. Similarly, a conductive body 132a is provided between the land electrode 117a on the second penetrating wiring 105a and the land electrode 119a on the third penetrating wiring 121a. A conductive body 132b is provided between the land electrode 117b on the second penetrating wiring 105b and the land electrode 119b on the third penetrating wiring 121b.

The penetrating wirings described above are each electrically connected with another penetrating wiring or another connection wiring via a land electrode. The land electrode may be used as a contact with another wiring or the like, or may be used as a part of a wiring. An example of structure of a penetrating wiring and land electrodes of the display device 100 in this embodiment will be described with reference to FIG. 8A, FIG. 8B, FIG. 9A and FIG. 9B.

Figure 8A:
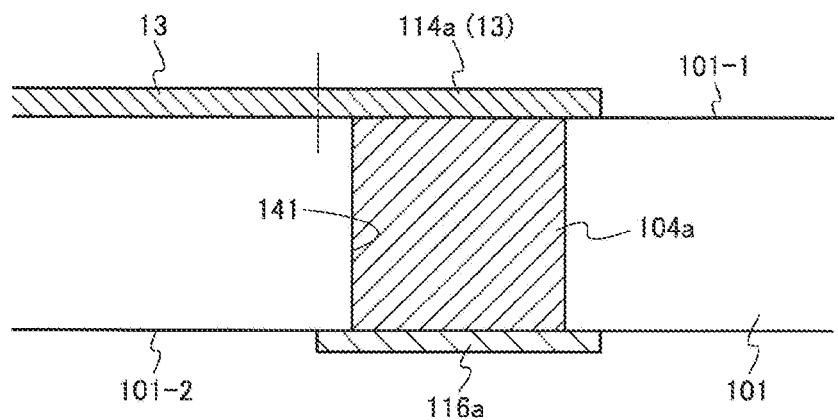
FIG. 8A shows a structure of a penetrating wiring in the display device in embodiment 1.
Figure 8B:
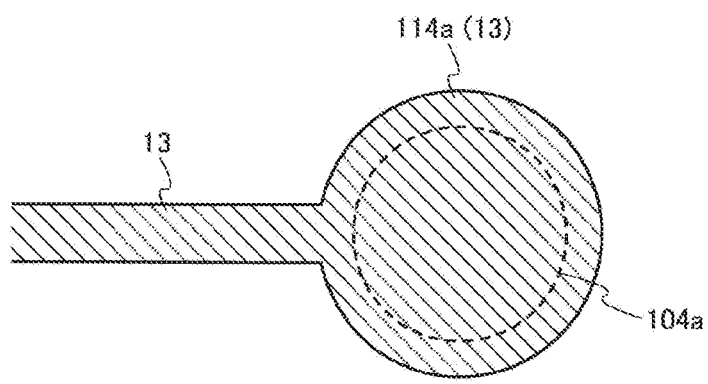
FIG. 8B shows a structure of the penetrating wiring in the display device in embodiment 1.

FIG. 8A and FIG. 8B show an example of structure of the first penetrating wiring 104a of the display device 100 in embodiment 1. FIG. 8A is a cross-sectional view of the first penetrating wiring 104a as seen from a side thereof. FIG. 8B is a plan view of the first penetrating wiring 104a. As shown in FIG. 8A and FIG. 8B, the land electrode 114a connected to a top end of the first penetrating wiring 104a is used as a part of the data signal line 13 shown in FIG. 1. Oppositely describing, a part of the data signal line 13 acts as a part of the land electrode 114a. As shown in FIG. 8A, the land electrode 114a is located on a first surface 101-1 of the substrate 101. The land electrode 116a is located on a second surface 101-2 of the substrate 101.

In this embodiment, the first penetrating wiring 104a is a conductor body (via) formed of copper or a copper-containing alloy. The land electrode 114a and the land electrode 116a are each a conductive layer having a stack structure including two titanium layers and an aluminum layer held between the two titanium layers. The first penetrating wiring 104a may be formed as follows. A through-hole 141 is formed in the substrate 101, and then the through-hole 141 is filled with copper or a copper-containing alloy. Namely, in the example shown in FIG. 8A and FIG. 8B, the first penetrating wiring 104a is located in the through-hole 141, the top end of the first penetrating wiring 104a is connected with the land electrode 114a, and a bottom end of the first penetrating wiring 104a is connected with the land electrode 116a.

It is preferred that the land electrode 114a and the land electrode 116a each have a diameter that is 10 to 20% longer than the diameter of the first penetrating wiring 104a. In the case where the diameter of each of the land electrode 114a and the land electrode 116a is longer than the diameter of the first penetrating wiring 104a, a designing margin is provided with certainty to curve the substrate 101 and bond the substrate 101 with the spacer 120.

Figure 9A:
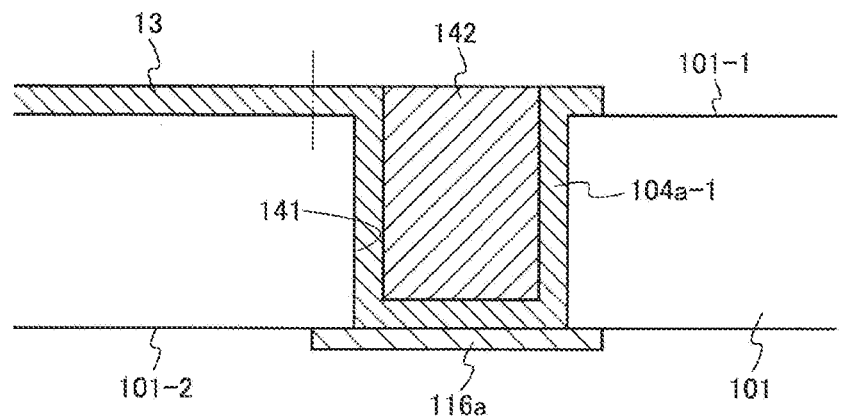
FIG. 9A shows a structure of a modified penetrating wiring in the display device in embodiment 1.
Figure 9B:
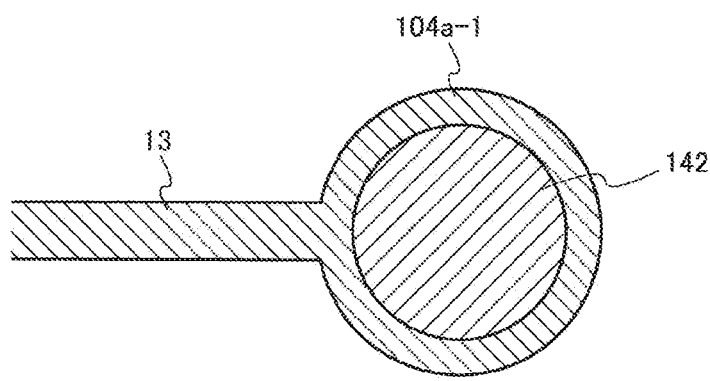
FIG. 9B shows a structure of the modified penetrating wiring in the display device in embodiment 1.

FIG. 9A and FIG. 9B show an example of structure of a penetrating wiring in a modification of the display device 100 in embodiment 1. FIG. 9A is a cross-sectional view of a first penetrating wiring 104a-1 as seen from a side thereof. FIG. 9B is a plan view of the first penetrating wiring 104a-1. As shown in FIG. 9A and FIG. 9B, the first penetrating wiring 104a-1 is used as a part of the data signal line 13 shown in FIG. 1. Namely, a part of the data signal line 13 acts as the first penetrating wiring 104a-1.

In the example shown in FIG. 9A and FIG. 9B, the first penetrating wiring 104a-1 acting as a part of the data signal line 13 is provided on the first surface 101-1 of the substrate 101 and on an inner wall of the through-hole 141. The first penetrating wiring 104a-1 is connected with the land electrode 116a at a bottom end of the through-hole 141. In addition, in this embodiment, the through-hole 141 is filled with a conductive layer 142 formed of copper or a copper-containing alloy. It is not indispensable to fill the through-hole 141 with the conductive layer 142. For example, the through-hole 141 may be filled with a resin material. Alternatively, the through-hole 141 may be filled with nitrogen gas or noble gas, or the inside of the through-hole 141 may be kept vacuum. In the case where the through-hole 141 is filled with nitrogen gas or noble gas or in the case where the inside of the through-hole 141 is kept vacuum, plating may be performed in the nitrogen gas, in the noble gas or in the vacuum state to close a top end of the through-hole 141.

The structure shown in FIG. 9A and FIG. 9B is formed as follows. First, the land electrode 116a is formed on the second surface 101-2 of the substrate 101, and then the through-hole 141 is formed in the substrate 101 so as to expose a part of the land electrode 116a. After the formation of the through-hole 141, the first penetrating wiring 104a-1 is formed by, for example, sputtering. Then, the conductive layer 142 is formed inside the through-hole 141 by, for example, electroplating or the like.

<Method for Manufacturing the Display Device>

Now, a method for manufacturing the display device 100 in embodiment 1 will be described. FIG. 10A, FIG. 10B and FIG. 10C show the method for manufacturing the display device 100 in embodiment 1.

First, as shown in FIG. 10A, a resin layer 202 is formed on a support substrate 201. In this embodiment, a glass substrate is used as the support substrate 201. In this embodiment, a layer formed of polyimide is used as the resin layer 202. After the formation of the resin layer 202, a first through-hole 203 and a second through-hole 204 are formed in the resin layer 202. The first through-hole 203 and the second through-hole 204 may be formed by photolithography after the resin layer 202 is cured. The first through-hole 203 and the second through-hole 204 are not limited to being formed in this manner. Photosensitive polyimide may be used as a material of the resin layer 202, and the first through-hole 203 and the second through-hole 204 may be formed concurrently with the formation of the resin layer 202.

Next, as shown in FIG. 10B, a paste of a conductive material is buried in the first through-hole 203 and the second through-hole 204 to form the first penetrating wiring 104 and the second penetrating wiring 105. In this embodiment, the paste used to fill the first through-hole 203 and the second through-hole 204 to form the first penetrating wiring 104 and the second penetrating wiring 105 is formed of an alloy containing tin (Sn), silver (Ag) and copper (Cu). After the formation of the first penetrating wiring 104 and the second penetrating wiring 105, the land electrodes 114 and 115 are respectively formed on top ends of the first penetrating wiring 104 and the second penetrating wiring 105. In the example shown in FIG. 10B, the land electrode 114 is formed on the first penetrating wiring 104. In the case where a wiring extending from the display circuit 300 is directly connected with the first penetrating wiring 104, the land electrode 114 may be omitted.

Next, as shown in FIG. 10C, the display circuit 300 including the plurality of semiconductor elements (the selection transistor 15 and the driving transistor 16) are formed on the first surface of the resin layer 202 (corresponding to the substrate 101 shown in FIG. 3). The specific structure of the display circuit 300 is described above with reference to FIG. 3. The display circuit 300 may be formed by a known thin film formation process and a known photolithography process, and the method for forming the display circuit 300 is not described in detail herein. In this embodiment, during the formation of the display circuit 300, the display circuit 300 and the first penetrating wiring 104 are electrically connected with each other. Specifically, the data signal line 13 included in the display circuit 300 is extended to be connected with the land electrode 114. Thus, the display circuit 300 and the first penetrating wiring 104 are electrically connected with each other.

As described above, in this embodiment, the first penetrating wiring 104 and the second penetrating wiring 105 are first formed in the resin layer 202 (corresponding to the substrate 101 shown in FIG. 3), and then, the display circuit 300 is formed on the resin layer 202. The method for forming the first penetrating wiring 104 and the second penetrating wiring 105 is not limited to the method shown in FIG. 10B. For example, the first penetrating wiring 104 and the second penetrating wiring 105 may be formed by plating instead of the method of filling the through-holes with the Sn—Ag—Cu alloy.

FIG. 11A, FIG. 11B and FIG. 11C show a modification of the method for manufacturing the display device 100 in embodiment 1. As shown in FIG. 11A, in this modification, a seed layer 206 to be used for plating is formed on the support substrate 201. Specifically, a release layer 205 is first formed on the support substrate 201. A layer formed of a resin material may be used as the release layer 205. After the formation of the release layer 205, the seed layer 206 is formed on the release layer 205. In this embodiment, a layer containing copper is formed as the seed layer 206. After the formation of the seed layer 206, the resin layer 202 is formed on the seed layer 206, and the first through-hole 204 and the second through-hole 204 are formed.

Next, as shown in FIG. 11B, the first penetrating wiring 104 and the second penetrating wiring 105 are formed by plating. In this embodiment, the first penetrating wiring 104 and the second penetrating wiring 105 are formed by electroplating by use of copper sulfate. The first penetrating wiring 104 and the second penetrating wiring 105 are not limited to being forming in this manner, and may be formed of any metal material. The first penetrating wiring 104 and the second penetrating wiring 105 may be formed by a method other than plating.

Next, as shown in FIG. 11C, the display circuit 300 including the selection transistor 15 and the driving transistor 16 is formed on the resin layer 202. In this process, the data signal line 13 extending from the display circuit 300 is connected with the land electrode 114 on the first penetrating wiring 104. As a result, the display circuit 300 and the first penetrating wiring 104 are electrically connected with each other.

In this embodiment, the support substrate 201 is released from the display device 100 after the display circuit 300 and the first penetrating wiring 104 are electrically connected. Specifically, laser light is directed toward a rear surface of the support substrate 201 to denature the release layer 205 and thus to separate the support substrate 201 and the seed layer 206 from each other. After the support substrate 201 is released from the seed layer 206, the seed layer 206 is removed by etching. The seed layer 206 may be entirely removed or may be partially left. For example, after the seed layer 206 is removed to expose the ends of the first penetrating wiring 104 and the second penetrating wiring 105, the land electrodes (e.g., the land electrode 116a and the land electrode 117a shown in FIG. 6) to be connected with the first penetrating wiring 104 and the second penetrating wiring 105 may be formed. Alternatively, the seed layer 206 may be treated with photolithography to be left on the second surface of the resin layer 202 and used as the land electrodes to be connected with the first penetrating wiring 104 and the second penetrating wiring 105.

Embodiment 2

In this embodiment, the method for manufacturing the display device 100 is different from that in embodiment 1. In this embodiment, components that are common to those in embodiment 1 will bear the identical reference signs thereto, and descriptions thereof will be omitted.

FIG. 12A, FIG. 12B, FIG. 13A and FIG. 13B show a method for manufacturing the display device 100 in embodiment 2. First, as shown in FIG. 12A, the resin layer 202 is formed on the support substrate 201. After the formation of the resin layer 202, the display circuit 300 is formed on the resin layer 202. The specific structure of the display circuit 300 is described above with reference to FIG. 3. During the formation of the display circuit 300, the data signal line 13 is extended to be close to a region where the first penetrating wiring 104 will be formed later.

After the formation of the display circuit 300, the surface roughness caused by the display circuit 300 is flattened by the flattening layer 37. On the flattening layer 37, the light emitting element 20 (see FIG. 3) is formed. After the formation of the light emitting element 20, the sealing layer 46 is formed so as to cover the light emitting element 20 and the display circuit 300. FIG. 12A shows the insulating layers stacked in the process described above. Specifically, in a state shown in FIG. 12A, the flattening layer 37, the insulating layer 39, the bank 41, the first sealing layer 46a, the second sealing layer 46b and the third sealing layer 46c are formed on the display circuit 300 and the data signal line 13.

After the state shown in FIG. 12A is obtained, next, as shown in FIG. 12B, first through-holes 203a and 203b and second through-holes 204a and 204b are formed in the resin layer 202. Namely, in this embodiment, after the display circuit 300 and the light emitting element 20 are formed on the resin layer 202 and protected by the sealing layer 46, the through-holes are formed in the resin layer 202. In this embodiment, the through-holes are formed in the resin layer 202 by photolithography.

After the first through-holes 203a and 203b and the second through-holes 204a and 204b are formed in the resin layer 202, as shown in FIG. 13A, the first penetrating wirings 104a and 104b and the second penetrating wirings 105a and 105b are formed by substantially the same process as in embodiment 1. Then, the land electrodes 114a, 114b, 115a and 115b are respectively formed on the penetrating wirings. In this process, in this embodiment, the land electrode 114a and the data signal line 13 are electrically connected with each other. As a result, the display circuit 300 and the first penetrating wiring 104a are electrically connected with each other.

Next, as shown in FIG. 13B, the connection wiring 113 is formed on the sealing layer 46. As described above with reference to FIG. 1, the connection wiring 113 is provided to electrically connect the first sensor electrodes 111 adjacent to each other. After the formation of the connection wiring 113, the insulating layer 47 is formed. The insulating layer 47 has openings to partially expose the land electrodes 114b, 115a and 115b.

After the formation of the openings in the insulating layer 47, the second sensor electrode 112 is formed. Although not shown in FIG. 13B, the first sensor electrode 111 is also formed in this process. In this embodiment, the second sensor electrode 112 is partially extended to be used as the connection wiring 112a. Specifically, the connection wiring 112a is extended from a position on the sealing layer 46 to reach the land electrode 114b, and electrically connects the second sensor electrode 112 and the first penetrating wiring 104b to each other.

As described above, in this embodiment, the display circuit 300 and the light emitting element 20 are formed on the resin layer 202 and covered with the sealing layer 46, and then the first penetrating wiring 104 and the second penetrating wiring 105 are formed in the resin layer 202. The first penetrating wiring 104 and the second penetrating wiring 105 are not limited to being formed in this manner, and may be formed when the display circuit 300 is formed.

Figure 14A:
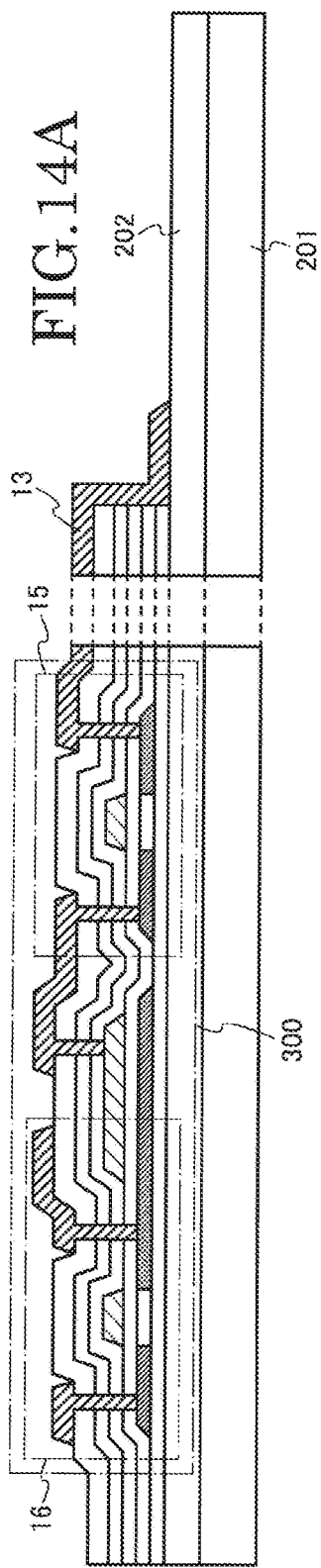
FIG. 14A shows a modified method for manufacturing the display device in embodiment 2.

FIG. 14A, FIG. 14B, FIG. 14C, FIG. 15A and FIG. 15B show a modification of the method for manufacturing the display device 100 in embodiment 2. First, as shown in FIG. 14A, the resin layer 202 is formed on the support substrate 201. After the formation of the resin layer 202, the display circuit 300 is formed on the resin layer 202. The specific structure of the display circuit 300 is described above with reference to FIG. 3. During the formation of the display circuit 300, the data signal line 13 is extended to be close to a region where the first penetrating wiring 104 will be formed later.

Figure 14B:
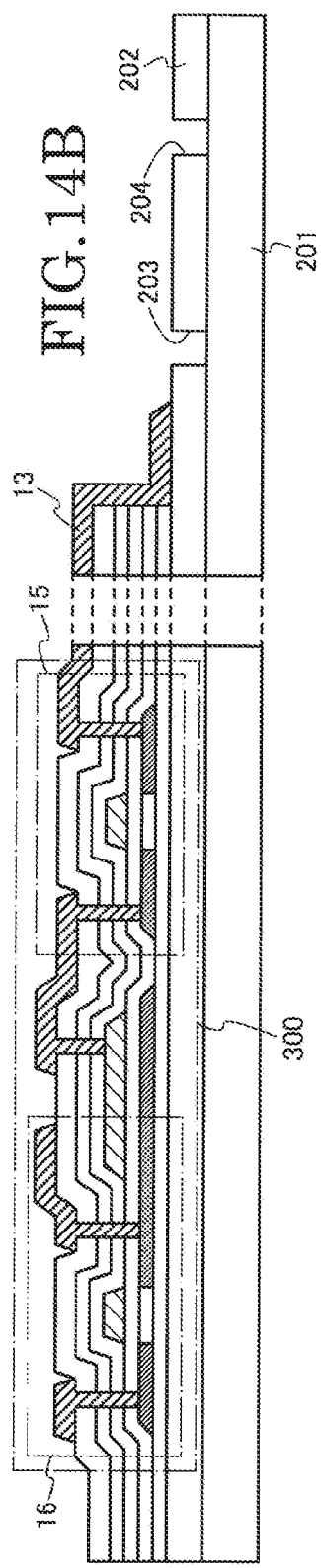
FIG. 14B shows the modified method for manufacturing the display device in embodiment 2.
Figure 14C:
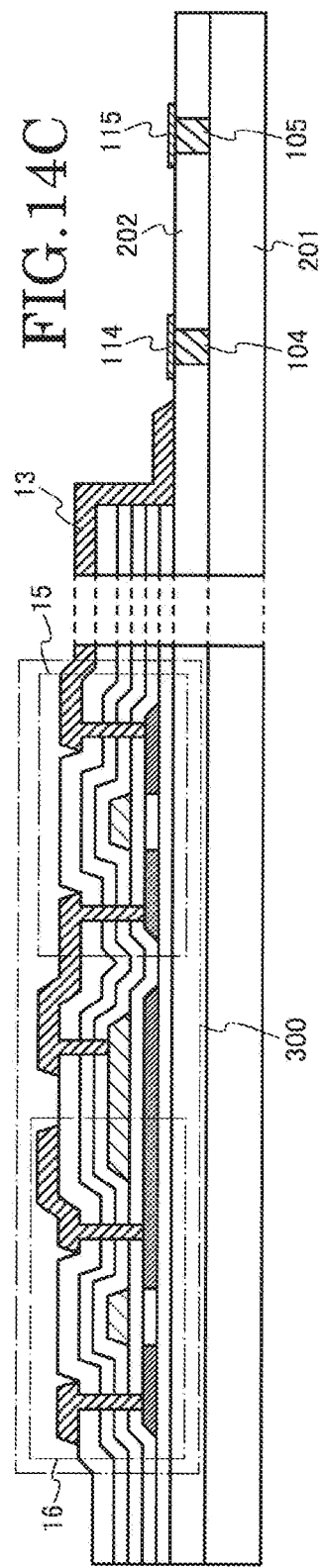
FIG. 14C shows the modified method for manufacturing the display device in embodiment 2.

After the formation of the display circuit 300, as shown in FIG. 14B, the first through-hole 203 and the second through-hole 204 are formed in the resin layer 202. After the formation of the first through-hole 203 and the second through-hole 204 in the resin layer 202, as shown in FIG. 14C, the first penetrating wiring 104 and the second penetrating wiring 105 are formed in substantially the same process as in embodiment 1. Then, the land electrodes 114 and 115 are respectively formed on the first penetrating wiring 104 and the second penetrating wiring 105.

Next, as shown in FIG. 15A, the flattening layer 37 covering the display circuit 300 is formed. After the formation of the flattening layer 37, a contact hole 37a and a contact hole 37b reaching the driving transistor 16 are formed in the flattening layer 37.

After the formation of the contact hole 37a and the contact hole 37b, as shown in FIG. 15B, the oxide conductive layers 38a and 38b to be electrically connected with the driving transistor 16 are formed. Concurrently with the oxide conductive layers 38a and 38b, connection wirings 207 and 208 are formed. Namely, the oxide conductive layers 38a and 38b and the connection wirings 207 and 208 are considered to be in the same conductive layer formed of the same material. In this embodiment, the oxide conductive layers 38a and 38b and the connection wirings 207 and 208 are formed by sputtering by use of an ITO target. The oxide conductive layers 38a and 38b and the connection wirings 207 and 208 are not limited to being formed in this manner.

The connection wiring 207 electrically connects the data signal line 13 and the land electrode 114 to each other. As a result, the display circuit 300 and the first penetrating wiring 104 are electrically connected with each other. The connection wiring 208 is connected with the land electrode 115. Namely, the connection wiring 208 corresponds to the connection wiring 106a (see FIG. 1) electrically connected with the second penetrating wiring 105. Therefore, in a state where the display device 100 is bent to electrically connect the first penetrating wiring 104 and the second penetrating wiring 105 to each other, the display circuit 300 and the connection wiring 208 are electrically connected with each other. Ends of a plurality of the connection wirings 208 form the terminal portion 108 as shown in FIG. 1.

As described above, according to the method for manufacturing the display device 100 in this embodiment, the first penetrating wiring 104 and the second penetrating wiring 105 may be formed when the display circuit 300 is formed. After the formation of the first penetrating wiring 104 and the second penetrating wiring 105, the light emitting element 20 and the touch sensor 110 may be formed in substantially the same process as in embodiment 1.

The above-described embodiments according to the present invention may be optionally combined as long as no contradiction occurs. The display devices described above in embodiments according to the present invention may have an element added thereto, or deleted therefrom, or may be changed in design optionally by a person of ordinary skill in the art. The methods described above in embodiments according to the present invention may have a step added thereto, or deleted therefrom, or may be changed in the condition optionally by a person of ordinary skill in the art. Such devices and methods are encompassed in the scope of the present invention as long as including the gist of the present invention.

In each of the above-described embodiments, an organic EL display device is described as the display device. The display device according to the present invention is not limited to an organic EL display device, and the present invention is applicable to any other display device (e.g., a liquid crystal display device or an electrophoretic display device).

Even functions and effects that are different from those provided by the above-described embodiments but are obvious from the description of this specification or are easily expectable by a person of ordinary skill in the art are naturally construed as being provided by the present invention.

What is claimed is:

1. A display device, comprising:
    a flexible substrate;
    a display portion provided on a first surface of the flexible substrate and including a plurality of pixels;
    a first penetrating wiring located to penetrate the flexible substrate;
    a second penetrating wiring located to penetrate the flexible substrate at a position farther from the display portion than the first penetrating wiring; and a spacer, wherein:
    the flexible substrate includes a curved portion between the first penetrating wiring and the second penetrating wiring, the first penetrating wiring and the second penetrating wiring are electrically connected with each other without being extended on the curved portion, the flexible substrate includes a first region including the first penetrating wiring, a second region including the second penetrating wiring, and a third region including the curved portion, the spacer is located between the first region and the second region, and the first penetrating wiring and the second penetrating wiring are electrically connected with each other via a third penetrating wiring located to penetrate the spacer.

2. The display device according to claim 1, wherein the first penetrating wiring and the second penetrating wiring overlap each other as seen in a plan view and are electrically connected with each other in a direction penetrating the flexible substrate.

3. The display device according to claim 2, wherein the first penetrating wiring and the second penetrating wiring are electrically connected with each other while ends thereof closer to a second surface opposite to the first surface face each other.

4. The display device according to claim 1, wherein:
the second penetrating wiring is electrically connected with a terminal portion provided on the first surface of the flexible substrate, and
the terminal portion does not overlap the second penetrating wiring as seen in a plan view.

5. The display device according to claim 4, wherein the second penetrating wiring is electrically connected with an electronic component connected with the terminal portion.

6. A method for manufacturing a display device, comprising:
forming a resin layer on a support substrate;
forming a first through-hole and a second through-hole in the resin layer;
forming a first penetrating wiring in the first through-hole and forming a second penetrating wiring in the second through-hole;
forming a display circuit including a plurality of semiconductor elements on a first surface of the resin layer; and
releasing the resin layer from the support substrate, and then curving the resin layer at a position between the first penetrating wiring and the second penetrating wiring to electrically connect the first penetrating wiring and the second penetrating wiring to each other,
wherein:
after the resin layer is released from the support substrate, a spacer is located on a second surface of the resin layer opposite to the first layer to electrically connect the first penetrating wiring with a third penetrating wiring located to penetrate the spacer, and
the resin layer is curved at a position between the first penetrating wiring and the second penetrating wiring to electrically connect the second penetrating wiring and the third penetrating wiring to each other.

7. The method for manufacturing a display device according to claim 6, wherein during the formation of the display circuit, the display circuit and the first penetrating wiring are electrically connected with each other.

8. The method for manufacturing a display device according to claim 6, further comprising locating, on the first surface of the resin layer, an electronic component to be electrically connected with the second penetrating wiring.

9. The method for manufacturing a display device according to claim 8, wherein the electronic component is electrically connected with the second penetrating wiring via a terminal portion provided on the first surface of the resin layer.

10. A method for manufacturing a display device, comprising:
forming a resin layer on a support substrate;
forming a display circuit including a plurality of semiconductor elements on a first surface of the resin layer;
forming a first through-hole and a second through-hole in the resin layer;
forming a first penetrating wiring in the first through-hole and forming a second penetrating wiring in the second through-hole; and
releasing the resin layer from the support substrate, and then curving the resin layer at a position between the first penetrating wiring and the second penetrating wiring to electrically connect the first penetrating wiring and the second penetrating wiring to each other,
wherein:
after the resin layer is released from the support substrate, a spacer is located on a second surface of the resin layer opposite to the first layer to electrically connect the first penetrating wiring with a third penetrating wiring located to penetrate the spacer, and
the resin layer is curved at a position between the first penetrating wiring and the second penetrating wiring to electrically connect the second penetrating wiring and the third penetrating wiring to each other.

11. The method for manufacturing a display device according to claim 10, further comprising, after the formation of the display circuit, forming a plurality of light emitting elements on the display circuit and forming a sealing layer covering the plurality of light emitting elements,
wherein after the formation of the sealing layer, the first through-hole, the second through-hole, the first penetrating wiring and the second penetrating wiring are formed to electrically connect the display circuit and the first penetrating wiring to each other.

12. The method for manufacturing a display device according to claim 10, further comprising locating, on the first surface of the resin layer, an electronic component to be electrically connected with the second penetrating wiring.

13. The method for manufacturing a display device according to claim 12, wherein the electronic component is electrically connected with the second penetrating wiring via a terminal portion provided on the first surface of the resin layer.

* * * * *